United States Patent
Skocki

(10) Patent No.: US 6,657,273 B2
(45) Date of Patent: Dec. 2, 2003

(54) TERMINATION FOR HIGH VOLTAGE SCHOTTKY DIODE

(75) Inventor: Slawomir Skocki, Turin (IT)

(73) Assignee: International Rectifirer Corporation, El Segundo, CA (US)

( * ) Notice: Subject to any disclaimer, the term of this patent is extended or adjusted under 35 U.S.C. 154(b) by 0 days.

(21) Appl. No.: 10/170,859

(22) Filed: Jun. 12, 2002

(65) Prior Publication Data

US 2002/0190338 A1 Dec. 19, 2002

Related U.S. Application Data

(60) Provisional application No. 60/297,502, filed on Jun. 12, 2001.

(51) Int. Cl.$^7$ ............................................. H01L 31/108
(52) U.S. Cl. ........................ 257/471; 257/471; 257/475
(58) Field of Search ................................. 257/471, 684, 257/481, 558, 485, 486; 357/15; 438/570

(56) References Cited

U.S. PATENT DOCUMENTS

| | | | | |
|---|---|---|---|---|
| 4,380,021 A | * | 4/1983 | Matsuyama et al. | 357/15 |
| 4,742,377 A | * | 5/1988 | Einthoven | 357/15 |
| 4,899,199 A | * | 2/1990 | Gould | 357/15 |
| 5,163,178 A | * | 11/1992 | Gomi et al. | 257/558 |
| 5,859,465 A | * | 1/1999 | Spring et al. | 257/484 |
| 6,191,015 B1 | * | 2/2001 | Losehand et al. | 438/570 |

* cited by examiner

Primary Examiner—David Nelms
Assistant Examiner—Thinh T. Nguyen
(74) Attorney, Agent, or Firm—Ostrolenk, Faber, Gerb & Soffen, LLP

(57) ABSTRACT

A composite field ring for a Schottky diode has a low concentration deep portion to increase breakdown voltage withstand and a high concentration, shallow region to enable minority carrier injection during high forward current conduction. The composite ring permits a reduction in the thickness of the epitaxially formed layer which receives the Schottky barrier metal.

18 Claims, 1 Drawing Sheet

TERMINATION FOR HIGH VOLTAGE SCHOTTKY DIODE

RELATED APPLICATION

This application claims the benefit of U.S. Provisional Application No. 60/297,502, filed Jun. 12, 2001.

FIELD OF THE INVENTION

This invention relates to relates to Schottky diode devices and more specifically relates to a novel termination for a Schottky diode.

BACKGROUND OF THE INVENTION

Schottky diodes are well known devices in which a metal contact of high work function material, such as molybdenum, platinum, tungsten, palladium, titanium and their silicides are in direct contact with a silicon substrate, usually an N type epitaxially formed silicon layer formed on an $N^+$ silicon substrate.

It is also known that a $P^+$ guard ring diffusion should surround the periphery of the active Schottky contact area to permit higher breakdown voltage. The guard rings used have a high $P^+$ concentration characterized in having a surface conductivity of about 180 ohms per square (a concentration of about 6E18 atoms/cm$^3$) for a 30 to 45 volt Schottky.

It is desirable to use a thinner epitaxial layer and have a higher breakdown voltage if possible. It is known that a higher breakdown voltage can be obtained by using a reduced concentration guard ring which has a higher avalanche capability. However, when the guard ring concentration is reduced, the P/N junction efficiency in injecting minority carriers is low, resulting in a very high forward drop at high forward current.

BRIEF SUMMARY OF THE INVENTION

In accordance with the invention, a reduced concentration guard ring is provided for a high voltage Schottky (for example, a 100 volt Schottky) and a shallow $P^+$ region is added at the top of the guard ring to increase minority carrier injection at the P/N junction between the guard ring and epi at very high forward currents. As a result, the benefits of the lower concentration guard ring are retained and a thinner epi layer can be used for a given breakdown voltage.

By way of example, the guard ring diffusion may have a surface concentration producing a surface conductivity of about 1500 ohms per square (corresponding to a concentration of about 2E17 atoms/cm$^3$) and a depth of about 2.5 microns. A shallow high concentration ($P^+$) diffusion at the top of the guard ring may have a depth of about 0.5 microns and a concentration at the silicon surface of about 5E18 atoms/cm$^3$.

DETAILED DESCRIPTION OF THE DRAWINGS

Figure 1:
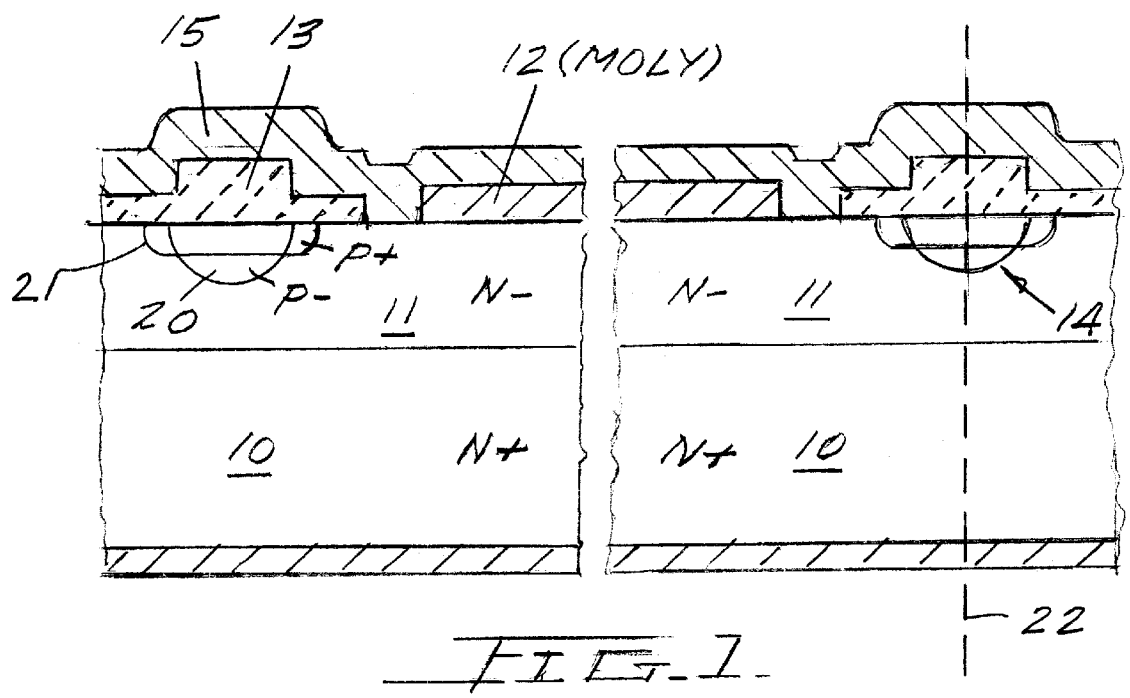
FIG. 1 is a cross-section of a portion of a Schottky device containing the novel guard ring of the invention.

FIG. 1 shows a Schottky diode which consists of an $N^+$ wafer 10 of monocrystaline silicon having an $N^-$ epitaxial ("epi") layer 11 deposited atop its surface. A molybdenum or other Schottky-forming metal layer 12 is deposited atop layer 11 and forms a Schottky rectifying barrier to the silicon. A field oxide ring 13 surrounds the active area of the Schottky metal 12 and serves as a mask for forming a diffused guard ring 14 which is the subject of this invention. A gap may be left between the inner periphery of oxide ring 13 and the outer periphery of molybdenum layer 12, find an aluminum or other contact layer 15 overlays the oxide ring 13 and the layer 12 and contacts the silicon surface of epi 11 surrounding the Schottky metal 12.

FIG. 1 shows only one guard ring 14. It should be understood that any number of spaced concentric diffusion rings could be used.

Figure 2:
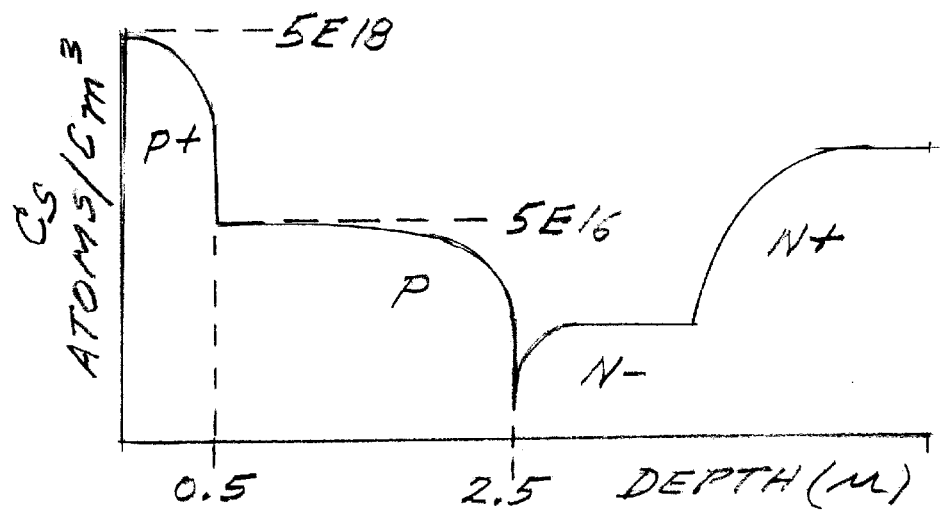
FIG. 2 is a diagram of the convention of the guard ring structure.

In accordance with the invention, guard ring 14 is a composite of two symmetric diffusions; a low concentration, deep diffusion 20, and a high concentration, shallow diffusion 21. Thus, as shown in FIG. 2, which describes the concentration along line 22 in FIG. 1, the low concentration $P^-$ diffusion 20 has a surface concentration of about 5E16 atoms/cm$^3$ and is formed by a $BB_r$ implant and a diffusion at about 780° C. for about 40 minutes. Diffusion 20 has a depth of about 2.5 microns. Since this diffusion has a low concentration, it produces a high breakdown voltage for the device. However, the low concentration ring 20, by itself, forms a $P^-/N$ junction to the $N^-$ silicon which tends to turn on at high forward current.

Thus, the shallow $P^+$ ring 21 is added atop ring 20 to prevent such turn on. The $P^+$ ring 21 is also formed by a $B_r$ implant and diffusion, but has a depth of only about 0.5 microns (so as to not interfere with the action of low concentration ring 20 in increasing break down voltage) and has a surface concentration of about 5E18 atoms/cm$^3$ to prevent turn on of the guard ring diffusion under high forward current. It also permits the reduction in the thickness of epi layer 11.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A Schottky diode comprising an $N^+$ silicon substrate having an $N^-$ epitaxially deposited layer on its top surface; said epitaxially deposited layer having at least one field ring diffusion in its top surface, which encloses an active Schottky area; a Schottky forming material in contact with said active area; said guard ring comprising a composite of a first diffusion region extending into said epitaxial layer for a first depth and having a first concentration and a second diffusion region superimposed on said first diffusion and extending into said epitaxial layer for a second depth which is shallower than said first depth and having a second concentration which is greater than said first concentration, said second diffusion forming a PN junction with said epitaxial deposited layer.

2. The Scottky diode of claim 1, wherein said second diffusion of lower concentration than said first diffusion permits a reduction in the necessary thickness of said epitaxial layer to withstand a given breakdown voltage, and wherein said first diffusion of higher concentration enables injection of minority carriers during a high forward current conduction.

3. The Schottky diode of claim 1, which further includes a contact metal fixed to the bottom of said substrate.

4. The Schottky diode of claim 1, which further includes a field oxide layer formed atop said field ring diffusion.

5. The Schottky diode of claim 3, wherein said second diffusion of lower concentration than said first diffusion permits a reduction in the necessary thickness of said epitaxial layer to withstand a given breakdown voltage, and wherein said first diffusion of higher concentration enables injection of minority carriers during a high forward current conduction.

6. The Schottky diode of claim 4, wherein said second diffusion of lower concentration than said first diffusion permits a reduction in the necessary thickness of said epitaxial layer to withstand a given breakdown voltage, and wherein said first diffusion of higher concentration enables injection of minority carriers during a high forward current conduction.

7. The Schottky diode of claim 5, which further includes a field oxide layer formed atop said field ring diffusion.

8. The Schottky diode of claim 3, wherein said Schottky forming material is molybdenum; and a contact metal overlying said molybdenum.

9. The Schottky diode of claim 7, wherein said Schottky forming metal is molybdenum; and a contact metal overlying said molybdenum.

10. The Schottky diode of claim 1, wherein said first depth is about 5 times that of said second depth.

11. The Schottky diode of claim 7, wherein said first depth is about 5 times that of said second depth.

12. The Schottky diode of claim 10, wherein said first depth is approximately 2.5 microns and said second depth is approximately 0.5 microns.

13. The Schottky diode of claim 11, wherein said first depth is approximately 2.5 microns and said second depth is approximately 0.5 microns.

14. The Schottky diode of claim 1, wherein said first diffusion has a surface concentration of from about 5E16 atoms/cm$^3$ to 2E17 atoms/cm$^3$; and said second diffusion has a surface concentration of greater than about 5E18 atoms/cm$^3$.

15. The Schottky diode of claim 7, wherein said first diffusion has a surface concentration of from about 5E16 atoms/cm$^3$ to 2E17 atoms/cm$^3$; and said second diffusion has a surface concentration of greater than about 5E18 atoms/cm$^3$.

16. The Schottky diode of claim 12, wherein said first diffusion has a surface concentration of from about 5E16 atoms/cm$^3$ to 2E17 atoms/cm$^3$; and said second diffusion has a surface concentration of greater than about 5E18 atoms/cm$^3$.

17. The Schottky diode of claim 13, wherein said first diffusion has a surface concentration of from about 5E16 atoms/cm$^3$ to 2E17 atoms/cm$^3$; and said second diffusion has a surface concentration of greater th about 5E18 atoms/cm$^3$.

18. The Schottky diode of claim 1, wherein said second surface concentration is at least 10 times as great as said second surface concentration.

* * * * *

UNITED STATES PATENT AND TRADEMARK OFFICE
CERTIFICATE OF CORRECTION

PATENT NO.   : 6,657,273 B2
DATED        : December 2, 2003
INVENTOR(S)  : Slawomir Skocki It is certified that error appears in the above-identified patent and that said Letters Patent is hereby corrected as shown below:

<u>Title page,</u>
Item [75], change the Inventor to:
-- Slawomir Skocki, Torino (IT) -- ; and
Item [73], change Assignee to:
-- International Rectifier Corporation, El Segundo, CA (US) --.

Signed and Sealed this

Sixth Day of April, 2004

JON W. DUDAS
*Acting Director of the United States Patent and Trademark Office*